US010666051B2

(12) United States Patent
Venkatasubramanian et al.

(10) Patent No.: US 10,666,051 B2
(45) Date of Patent: May 26, 2020

(54) ELECTRICAL CIRCUIT CONTROL IN POWER SYSTEMS

(71) Applicant: Washington State University, Pullman, WA (US)

(72) Inventors: Vaithianathan Venkatasubramanian, Pullman, WA (US); Ebrahim Rezaei, Pullman, WA (US)

(73) Assignee: Washington State University, Pullman, WA (US)

( * ) Notice: Subject to any disclaimer, the term of this patent is extended or adjusted under 35 U.S.C. 154(b) by 147 days.

(21) Appl. No.: 16/020,781

(22) Filed: Jun. 27, 2018

(65) Prior Publication Data

US 2019/0006847 A1 Jan. 3, 2019

Related U.S. Application Data

(60) Provisional application No. 62/526,771, filed on Jun. 29, 2017.

(51) Int. Cl.
*H02J 3/24* (2006.01)
*G05B 9/02* (2006.01)
*H02J 13/00* (2006.01)
*G01R 19/25* (2006.01)
*H02J 3/18* (2006.01)

(52) U.S. Cl.
CPC ............ *H02J 3/24* (2013.01); *G01R 19/2513* (2013.01); *G05B 9/02* (2013.01); *H02J 13/0017* (2013.01); *H02J 3/1835* (2013.01); *H02J 3/1878* (2013.01); *Y02E 60/728* (2013.01); *Y04S 10/265* (2013.01)

(58) Field of Classification Search
CPC ..... G06F 1/30; G01R 19/2513; Y02E 60/728; Y04S 10/265

USPC .......................................................... 713/300
See application file for complete search history.

(56) References Cited

U.S. PATENT DOCUMENTS

| 8,000,914 B2 * | 8/2011 | Venkatasubramanian ................... G01R 19/2513 702/59 |
| 8,108,184 B2 * | 1/2012 | Fardanesh ............. G06F 17/504 703/18 |
| 9,217,775 B2 * | 12/2015 | Mousavi ............ G01R 31/3274 |

OTHER PUBLICATIONS

"Assessing Gaussian Assumption of PMU Measurement Error Using Field Data"; Shaobu Wang, Zhenyu Huang, and Ruisheng Diao; IEEE Transactions on Power Delivery; Dated Oct. 5, 2017; 3 Pages (Year: 2017).*

(Continued)

*Primary Examiner* — Brian T Misiura
(74) *Attorney, Agent, or Firm* — Liang IP, PLLC

(57) ABSTRACT

Electrical circuit control techniques in power systems are disclosed herein. In one embodiment, a supervisory computer in the power system can be configured to fit phasor measurement data from phasor measurement units into a Gaussian distribution with a corresponding Gaussian confidence level. When the Gaussian confidence level of the fitted Gaussian distribution is above a Gaussian confidence threshold, the supervisory computer can be configured to perform an ambient analysis on the received phasor measurement data to determine an operating characteristic of the power system. The supervisory computer can then automatically applying at least one electrical circuit control action to the power system in response to the determined operating characteristic.

20 Claims, 8 Drawing Sheets

(56) References Cited

OTHER PUBLICATIONS

"Measurement of Power Flow Variations in Gaussian Plane Using Phasor Measuring Unit"; Ushnik Chakrabarti, Amlan Chakrabarti, and Sudhangshu Sarkar; 2016 IEEE First International Conference on Control, Measurement and Instrumentation (CMI); Dated 2016; 5 Pages (Year: 2016).*

"Phasor and frequency estimation in Phasor Measurement unit (PMU) using least square technique"; Mansi Vats, and Sangeeta Kamboj; International Journal of Advanced Research in Computer Engineering & Technology (IJARCET) vol. 5, Issue 5, May 2016; 4 Pages (Year: 2016).*

"Self-Correction Strategies for Frequency Domain Ringdown Analysis"; Ebrahim Renzaei, and Vaithianathan "Mani" Venkatasubramanian; 2015 48th Hawaii International Conference on System Sciences; Dated Jan. 2015; 10 Pages (Year: 2015).*

"Power Distribution System Synchrophasors with Non-Gaussian Errors: Real-World Measurements and Analysis"; Can Huang, Charanraj A. Thimmisetty, Xiao Chen, Mert Korkali, Vaibhav Donde, Emma Stewart, Philip Top, Charles Tong, and Liang Min; Dated 2018; 4 Pages (Year: 2018).*

* cited by examiner

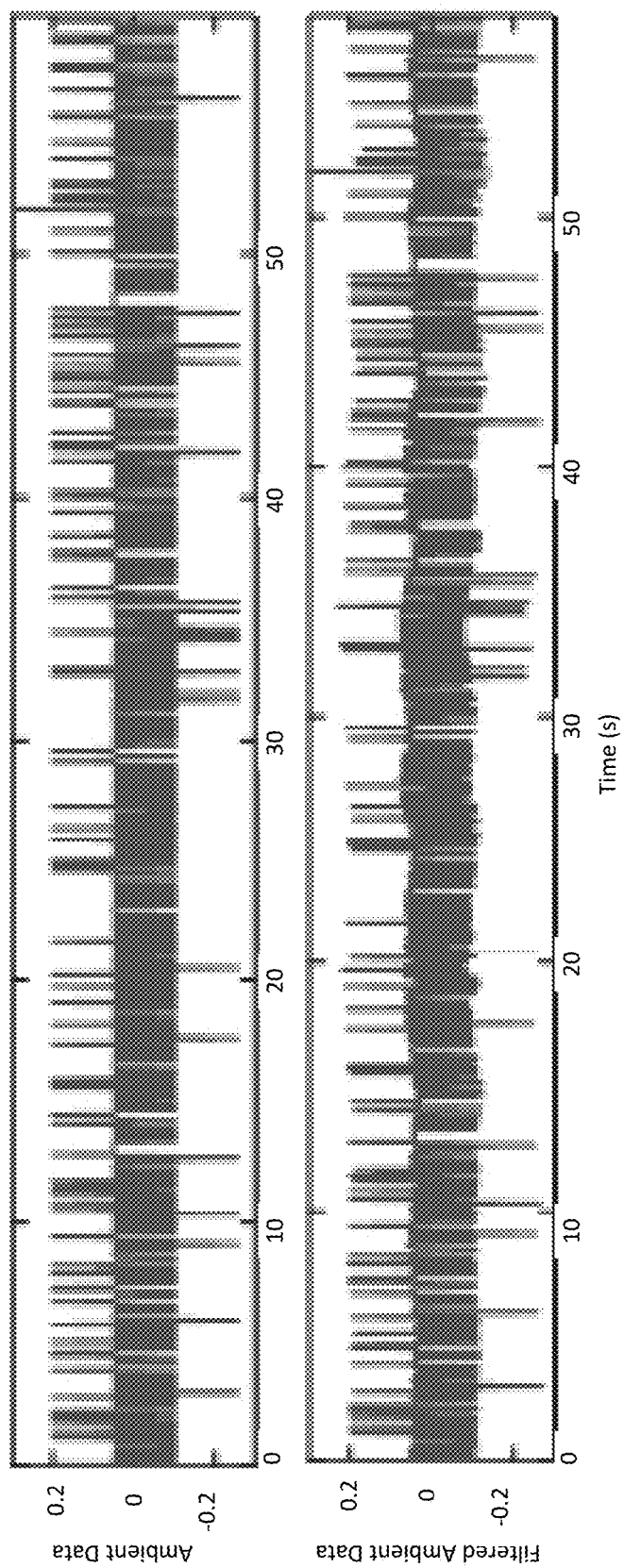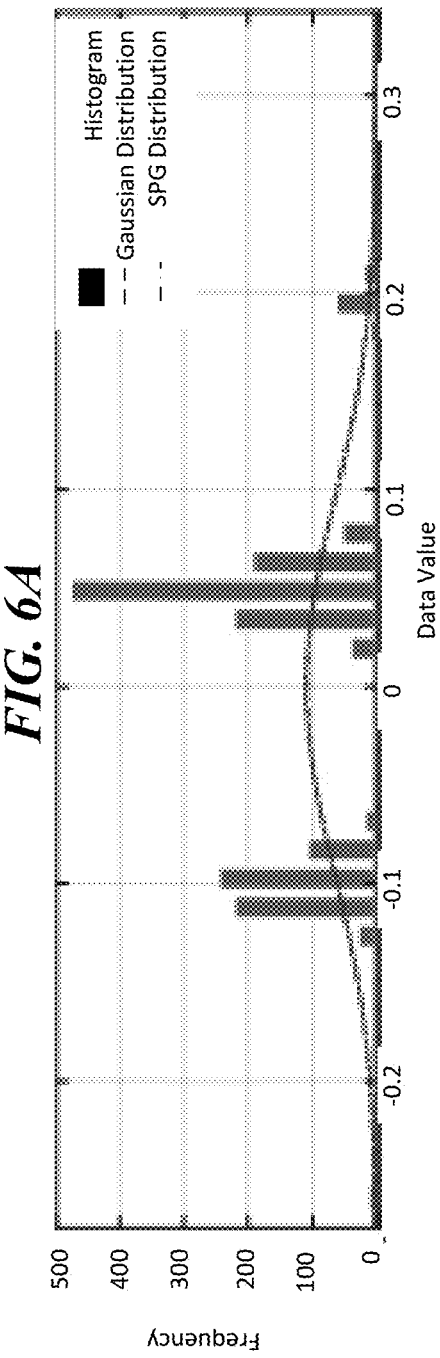
FIG. 6A
FIG. 6B

ELECTRICAL CIRCUIT CONTROL IN POWER SYSTEMS

CROSS-REFERENCE TO RELATED APPLICATION(S)

This application claims priority to U.S. Provisional Application No. 62/526,771, filed on Jun. 29, 2017, the disclosure of which is incorporated herein by reference in its entirety.

STATEMENT REGARDING FEDERALLY SPONSORED RESEARCH

This invention was made with government support under grant no. DE-AC02-05CH11231 awarded by U.S. Department of Energy by subcontract no. LBNL-7049758, and contract no. 00070648 awarded by U.S. Department of Energy through Bonneville Power Administration. The government has certain rights in the invention.

BACKGROUND

Synchronized phasors are time-synchronized values that represent both a voltage/current magnitude and a phase angle of electricity. Synchrophasors can be measured by high-speed monitors called Phasor Measurement Units (PMUs) located at various points in a power system. In operation, phasor measurement data from PMUs can be collected and aggregated to derive synchrophasors by a power data concentrator (PDC) operatively coupled to the PMUs via a communications network (e.g., the Internet). The PDC can "align" phasor measurement data from the PMUs based on time stamps to derived synchrophasors. The derived synchrophasors can then be used for monitoring and controlling operations of the power system, such as for maintaining a stable voltage in the power system.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

With the increasing number of PMUs installed in power systems, huge amount of phasor measurement data becomes available. Such phasor measurement data can be used in various tools for power system monitoring and/or control. For example, tools like oscillation monitoring allows monitoring dynamic states (e.g., voltage oscillations) of power systems by extracting modal content from the phasor measurement data in real time. Corrective measures can then be deployed in a power system in response to detecting an oscillation.

Though useful in reflecting current conditions of power systems, the phasor measurement data may not always be valid. For instance, synchronized phasor measurements can provide suitable accuracies only when a power system is in steady state. During transient conditions, e.g., power swings or transient changes in power system frequency, both magnitude and phase angle of measured phasor can change. Thus, Fourier-like algorithms derived from signal models that assume constant amplitude, frequency, and phase angle for computing synchrophasors can provide erroneous results. Changes in amplitude, frequency, or phase angle can also generate cross coupling errors. Hence, computing synchrophasors assuming stead state can have limitations for achieving high levels of accuracy during transient conditions in power systems.

Without being bound by theory, it is believed that a power system is a large non-linear physical system. If loads are considered as inputs to a power system, then phasor measurement data may be considered as output. In normal operation, changes in total loads in a power system tend to be random in short periods. Thus, load variations can be usually modeled as white Gaussian noise. Also, when load changes are small, a non-linear system can be linearized around operating points and be approximated by an equivalent linear time invariant or LTI system. Thus, a power system in normal operation can be modeled as an LTI system driven by white Gaussian noise. The phasor measurement data collected under such a random-load condition is referred to as ambient data. A power spectral density of ambient data is expected to reflect a transfer function of the power system.

Several embodiments of the disclosed technology are directed to electrical circuit control in power systems based on highly accurate phasor measurement data analysis. The inventors have recognized that a statistical distribution pattern of phasor measurement data can provide insight into operational conditions of a power system, load variations of the power system, quality of phasor measurement data, and other power system characteristics. In one implementation, phasor measurement data can be initially analyzed to determine whether the received phasor measurement data has a Gaussian distribution. In response to determining that the phasor measurement data has a Gaussian distribution (e.g., above a Gaussian threshold confidence level of 95%), the phasor measurement data can be deemed as valid and used for ambient analysis for monitoring and control of the power system.

In response to determining that the phasor measurement data does not have a Gaussian distribution, the phasor measurement data can then be analyzed for a sinusoid plus Gaussian (SPG) distribution to determine whether there are any system modal oscillations. In response to determining that the phasor measurement data cannot be fitted to a SPG distribution within a threshold confidence level, the phasor measurement data can be deemed as invalid due to data anomalies in the absence of any power system events. Otherwise, the phasor measurement data can be deemed as valid and used for various power system monitoring and/or controlling via, for instance, ambient analysis.

As such, several embodiments of the disclosed technology can increase accuracy of power system parameters derived from phasor measurement data contain data by analyzing a statistical distribution of the phasor measurement data received from the PMUs. Analysis results can reveal whether the power system is in a generally steady state, has detectable oscillations, or have a power system event such as power failure. Analysis results can also reveal whether the received phasor measurement data has any anomalies due to, for instance, data compression. Thus, monitoring and/or control of power systems based on phasor measurement data can be improved.

BRIEF DESCRIPTION OF THE DRAWINGS

FIG. 6A shows one-minute of example current magnitude data from a PMU in another power system that contains data anomalies.

FIG. 6B illustrates a histogram of the dataset in FIG. 6A and Gaussian and SPG distribution fit.

DETAILED DESCRIPTION

Figure 1:
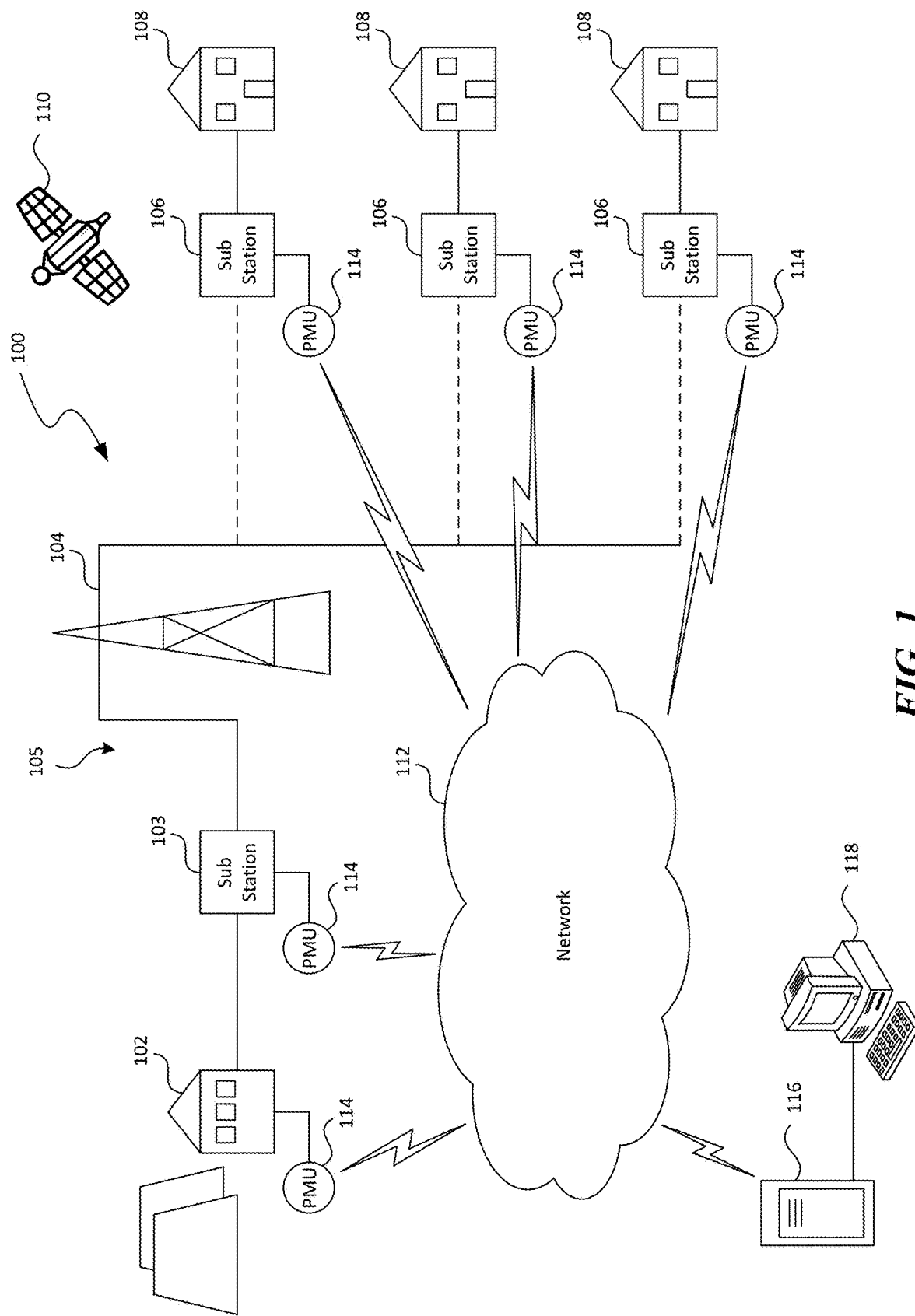
FIG. 1 is a schematic diagram of an example power system implementing phasor measurement data monitoring in accordance with embodiments of the technology.

Specific details of several embodiments of the disclosure are described below with reference to electrical circuit control based on phasor measurement data in power systems. Several embodiments can have configurations, components, or procedures different than those described in this section, and other embodiments may eliminate particular components or procedures. A person of ordinary skill in the relevant art, therefore, will understand that the invention may have other embodiments with additional elements, and/or may have other embodiments without several of the features shown and described below with reference to FIGS. 1-8.

As used herein, a "phasor" generally refers to a complex number representing a sinusoidal function whose amplitude (A), angular frequency (ω), and initial phase (θ) are time-invariant. For example, a phasor can include a voltage in a bus in a power system represented by a sinusoidal wave having an amplitude (A), angular frequency (ω), and initial phase (θ). Phasor measurement data are data generated by PMUs located at various points (e.g., substations, buses, etc.) in a power system to measure phasors in the power system. The phase measurement data can be time stamped and subsequently aligned to form synchronized phasors or synchrophasors.

Ambient data is typically expected to be a combination of damped natural oscillations and noise. Different situations can occur when phasor measurement data does not resemble ambient data. For example, clear and sustained oscillations can be indicators of either poorly damped natural mode(s) and/or external sources of oscillation. Temporary damped oscillations may also happen due to sudden changes in set-points of controllers or in the power system. Data quality is also an issue because PMU-based analysis such as oscillation and voltage stability analysis would not function properly when bad data is used for such analysis. Data anomalies such as compression, quantization, and constant value signals can cause phasor measurement data to deviate from ambient data. The following is a general discussion of observed and expected distribution of example datasets of operating conditions in a power system.

As discussed below, with sufficient number of data points, histogram is used as an approximation for a probability density function (PDF) of underlying distribution of a dataset. To construct the histogram, bins can be defined as equal or unequal intervals dividing a whole range of data from a maximum to a minimum. Then, by grouping all data points into the defined bins, the histogram is formed. For the histogram to be a reasonable approximation of the underlying PDF, a number of bin intervals may be chosen. It is believed that different numbers of bins may reveal different features of a dataset. Thus, a suitable value for the number of bins can vary based on the data analyzed and on the purpose of the study. As discussed in more detail below, the square root rule is used as an example technique to set the number of bins to be a square root of a number of data points. In other implementations, other suitable techniques may also be used to set the number of bins.

For a Gaussian or Normal distribution, a PDF is defined as:

$$f(x|\mu, \sigma^2) = \frac{1}{\sqrt{2\sigma^2\pi}} \exp\left(-\frac{(x-\mu)^2}{2\sigma^2}\right) \quad (1)$$

where μ is the mean and σ is the standard deviation. In this case, the expected PDF can be formed by substituting the sample estimations of μ and σ in (1). Assuming μ can be estimated by the sample mean of data, $\bar{x}$, one more equation is needed for estimating σ. Equation (2) relates the second central moment μ2 to the standard deviation as:

$$\mu_2 = \sigma^2 \quad (2)$$

The value of μ2 can be substituted by the general formula:

$$\bar{\mu}_n = \frac{1}{N-1} \sum_{i=1}^{N} (x_i - \bar{x})^n \quad (3)$$

where $\bar{\mu}_n$ is an unbiased estimator for n-th moment of the data.

Unlike a Normal distribution, PDF of an SPG distribution does not have a closed form expression. Assuming sinusoidal component is of the form A sin θ, where θ is uniformly distributed over [0,2π], and the Gaussian noise is zero-mean with standard deviation σ, the PDF for this distribution would be as follows:

$$f(x|\mu, \sigma^2, A^2/2) = \sum_{n=0}^{\infty} \frac{1}{n!n!} \left(\frac{a_0}{2}\right)^{2n} \varphi^{(2n)}\left(\frac{x-\mu}{\sigma}\right) \quad (4)$$

$$a_0^2 = \frac{A^2}{2\sigma^2}$$

where $$\varphi^{(k)}(v) = \frac{1}{\sqrt{2\pi}} \frac{d^k}{dv^k} e^{-v^2/2} \quad (5)$$

Based on Equation (4), to derive an expected PDF of the form SPG for a set of data, one needs to estimate A and σ first. Equation (6) below shows that second and fourth central moments for a SPG distribution can be written in terms of A and σ as:

$$\mu_2 = \sigma^2 + \frac{A^2}{2} \quad (6)$$

$$\mu_4 = 3\sigma^4 + 3\sigma^2 A^2 + 3\frac{A^4}{8} \quad (7)$$

In Equations (6) and (7), $\mu_2$ and $\mu_4$ are second and fourth moments of the distribution respectively and can be replaced by their unbiased estimators using Equation (3). Newton's method can be used at this stage to solve for A and σ.

Example Power System Overview

FIG. 1 is a schematic diagram of an overview of an example power system 100 in accordance with embodiments of the disclosed technology. As shown in FIG. 1, the power system 100 can include a power generating plant 102, a step-up substation 103, a transmission tower 104, a plurality of step-down substations 106, and a plurality of power consuming loads 108 interconnected with one another by a power grid 105. Even though only certain system components (e.g., one power generating plant 102 and one step-up substation 103) are illustrated in FIG. 1, in other embodiments, the power system 100 and/or the power grid 105 can include other system components in addition to or in lieu of those components shown in FIG. 1.

The power system 100 can also include a plurality of phasor measurement units ("PMUs") 114 individually coupled to various components of the power system 100. For example, as illustrated in FIG. 1, the power generating plant 102, the step-up substation 103, and each of the step-down substations 106 include one PMU 114. The PMUs 114 can be configured to measure current conditions (e.g., as represented by voltage, current, and/or other types of phasor measurements) of the transmitted power in the power system 100 based on a common time reference (e.g., a GPS satellite 110).

The power system 100 can also include a power data concentrator ("PDC") 116 operatively coupled to the PMUs 114 via a network 112 (e.g., an internet, an intranet, a wide area network, and/or other suitable types of network). The PDC 116 can include a logic processing device (e.g., a network server, a personal computer, etc.) configured to "align" phasor measurements from the PMUs 114 based on their time stamps with reference to the GPS satellite 110.

In the illustrated embodiment, the power system 100 includes an optional supervisory computer station 118 operatively coupled to the PDC 116. The supervisory computer station 118 can be configured to retrieve phasor measurement data from the PDC 116 and analyze the retrieved phasor measurement data to determine whether any data anomalies exist in the phasor measurement data, as described in more detail below. In response to determining that no data anomalies exist, the supervisory computer station 118 can further analyze the phasor measurement data in order to monitor and controlling electromechanical oscillation or other operating parameters in the power system 100.

In other embodiments, the PDC 116 can analyze the phasor measurement data received from the PMUs 114 for data anomalies and provide the analysis results to the supervisory computer station 118. In further embodiments, the power system 100 can include an analysis processor (not shown) or other suitable components operatively coupled to the PDC 116 and the supervisory computer station 118 to analyze the phasor measurement data collected by the PMUs 114. Each of the PDC 116, the supervisory computer station 118, or the analysis processor can include a server, a desktop computer, a laptop computer, a tablet computer, or other suitable types of a computing device. Example hardware/software components of a suitable computing device are described below with reference to FIG. 8. In any of the foregoing embodiments, the computing device can include a processor and a memory containing instructions executable by the processor to cause the computing device to perform operations such as those described in more detail below with reference to FIG. 7.

Framework for Characterizing Ambient Data

The following description is directed to a framework for characterizing ambient data in a power system, such as the power system 100 in FIG. 1. Operations discussed below can be performed by the supervisory computer station 118, the PDC 116, and/or other suitable components in the power system 100. In the following description, example datasets were used to demonstrate aspects of the disclosed technology. Embodiments of the disclosed technology can be applied similarly to other datasets of phasor measurements collected from PMUs from other suitable power systems.

Data from a power system may be pre-processed to filter out slow trends in the data. Operating points in a power system can change slowly to cause the ambient data to have some low-frequency components. In oscillation monitoring, since direct current (DC) and low-frequency trends are not the subject of modal analysis, a de-trend filter (e.g., a high-pass or band-pass filter) can be used to filter out these components while preserving modal content of the data. In example analysis performed, a finite impulse response (FIR) high-pass filter was used for de-trending. The used FIR filter was a minimax filter of order 103, with stop-band and pass-band frequencies set to 0.00 and 0.35 Hz, respectively.

Figure 2A:
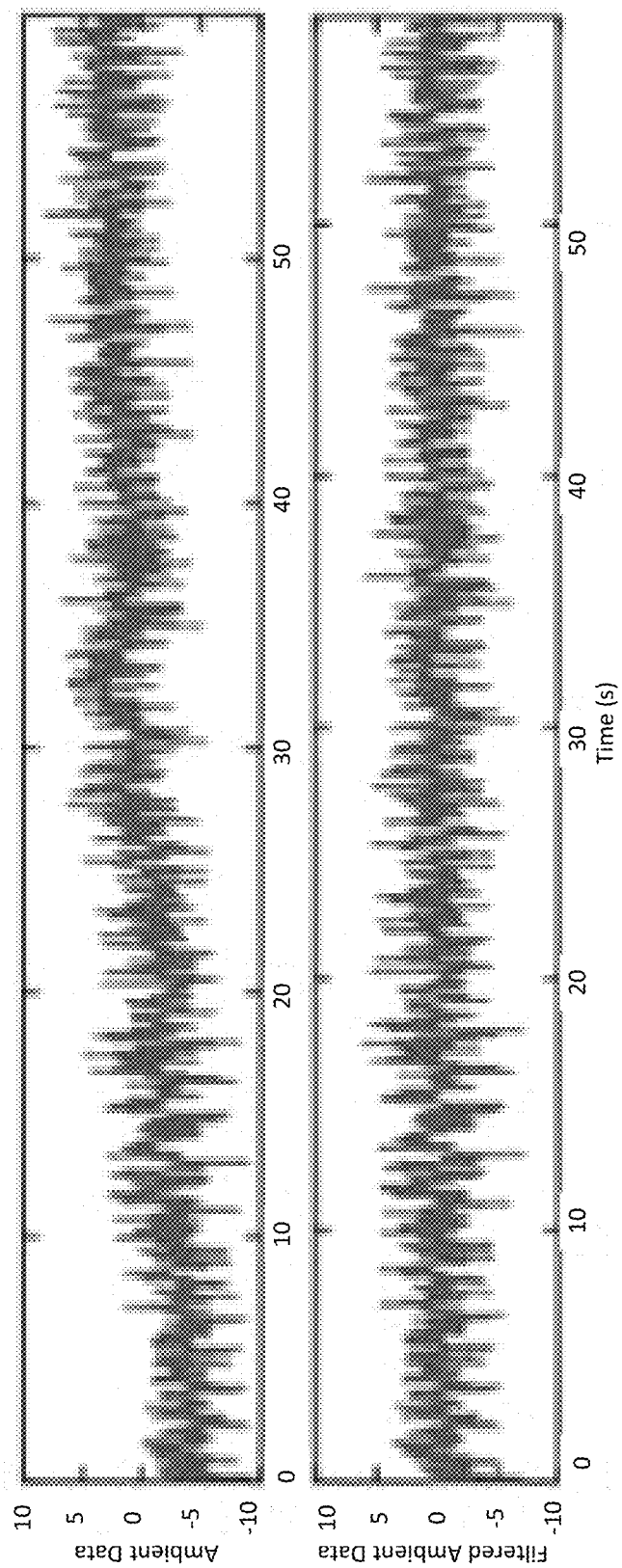
FIG. 2A is one-minute of example current magnitude dataset from a PMU in another power system that contains ambient data and filtered ambient data.
Figure 2B:
FIG. 2B illustrates a histogram of the dataset in FIG. 2A and Gaussian and SPG distribution fit.

According to aspects of the disclosed technology, a dataset of phasor measurement data can be initially analyzed for resemblance to ambient data and for SPG distribution. For example, data shown in FIG. 2A is considered typical ambient data that does not include any clear oscillation, a power event, or data anomaly issue. As shown in FIG. 2A, slow trends can be observed in the raw data which causes the data points to have a weak correlation with each other. Such weak correlation of low frequency trends can be removed using a de-trend filter. In FIG. 2B, numbers of bins can be chosen by using a square root of corresponding number of data points. Therefore, a bin number for the example dataset was 43. FIG. 2B shows the binned histogram of the filtered data as well as the PDFs for the best fit of Gaussian and SPG distributions. For Gaussian fit, DoF and $D_{\chi^2}$ are calculated to be 41 and 19.99, respectively. Using a Chi-squared table, the probability that the filtered data shown in FIG. 2B has Gaussian distribution is 0.998. For SPG fit, the best estimation for SNR was 0 which is consistent with the fact that the data has Gaussian distribution with high confidence.

Figure 3A:
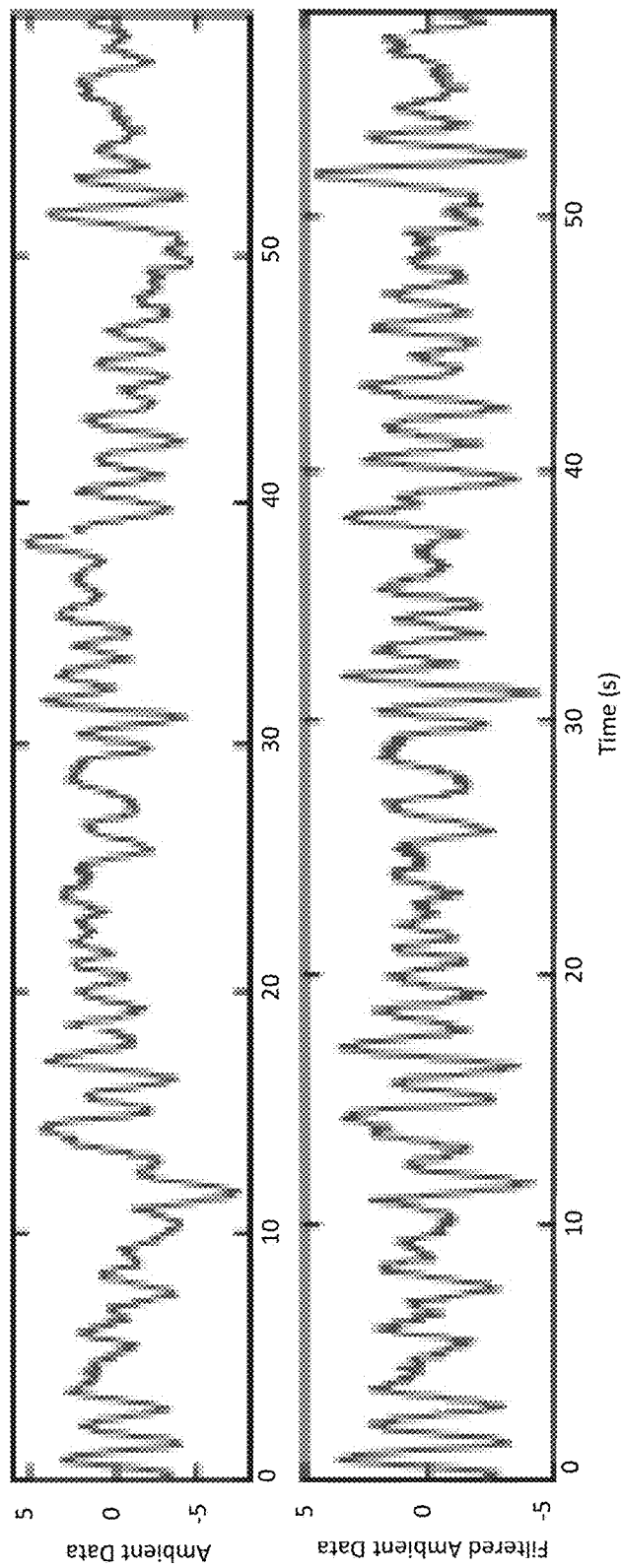
FIG. 3A shows one-minute of example current magnitude data from a PMU in another power system that contains damped oscillation.
Figure 3B:
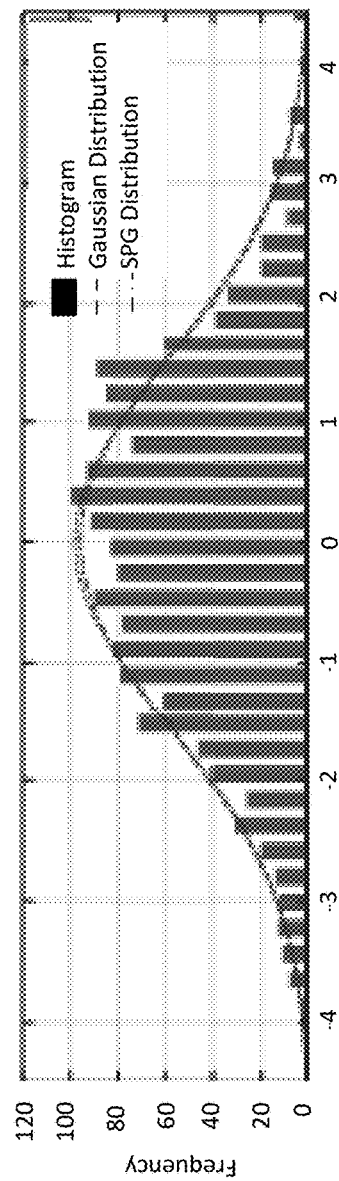
FIG. 3B illustrates a histogram of the dataset in FIG. 3A and Gaussian and SPG distribution fit.

FIG. 3A shows one-minute of example current magnitude data from a PMU in another power system. From the oscillation monitoring viewpoint, data shown in FIG. 3A is also considered a typical ambient data of power system. Data does not contain any event and has no quality issue. However, the main difference between this case and the case in FIG. 2A is in the presence of observable damped oscillations. FIG. 3B shows the binned histogram of the filtered data as well as the estimated PDF for the Gaussian and SPG distributions. From FIG. 3B, similarities between the models and the actual histogram can be observed. For Gaussian fit, DoF and $D_{x^2}$ are calculated to be 39 and 38.29, respectively. The probability that the filtered data has Gaussian distribution is 0.502 based on Chi-squared table. For SPG fit, the best estimation for SNR was 1.6 with 0.48 as the noise standard deviation. Subsequently, DoF and $D_{x^2}$ are calculated to be 38 and 38.38, respectively. The probability that the filtered data has SPG distribution is then estimated to be 0.452.

Figure 4A:
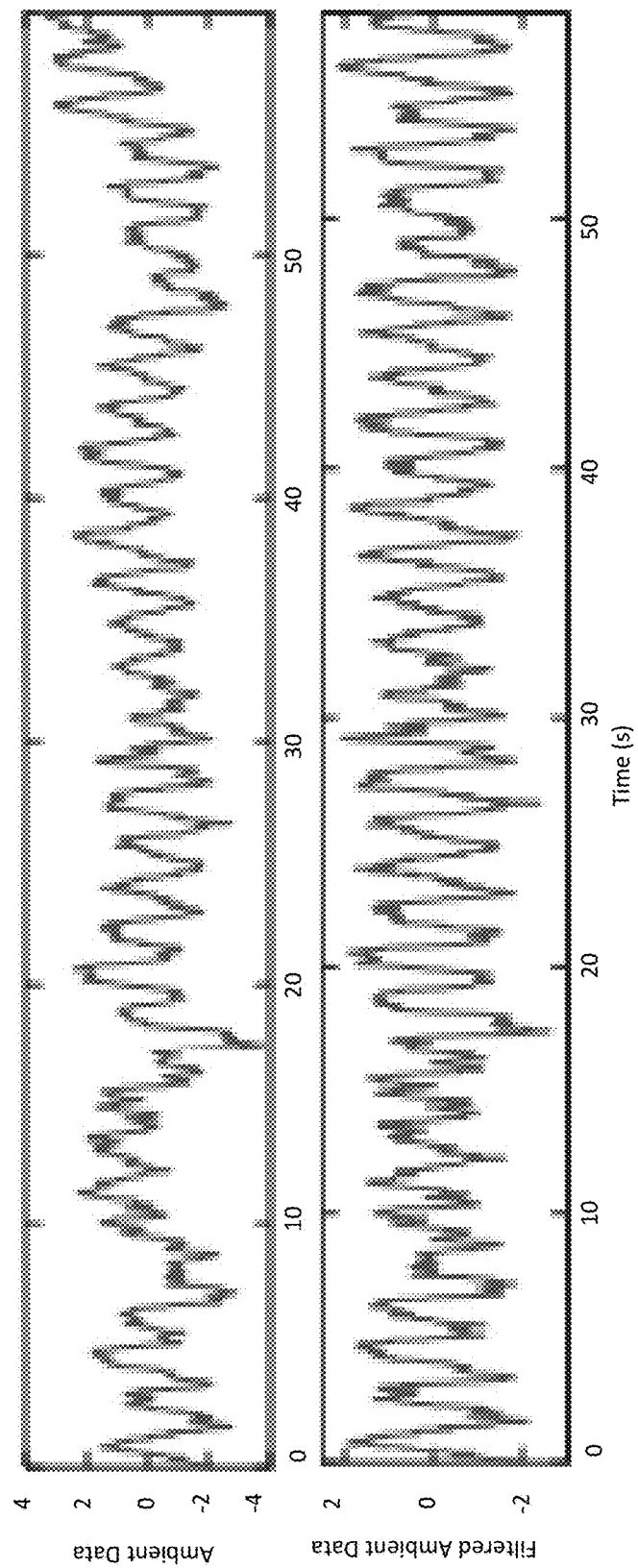
FIG. 4A shows one-minute of example current magnitude data from a PMU in another power system that contains forced oscillation.
Figure 4B:
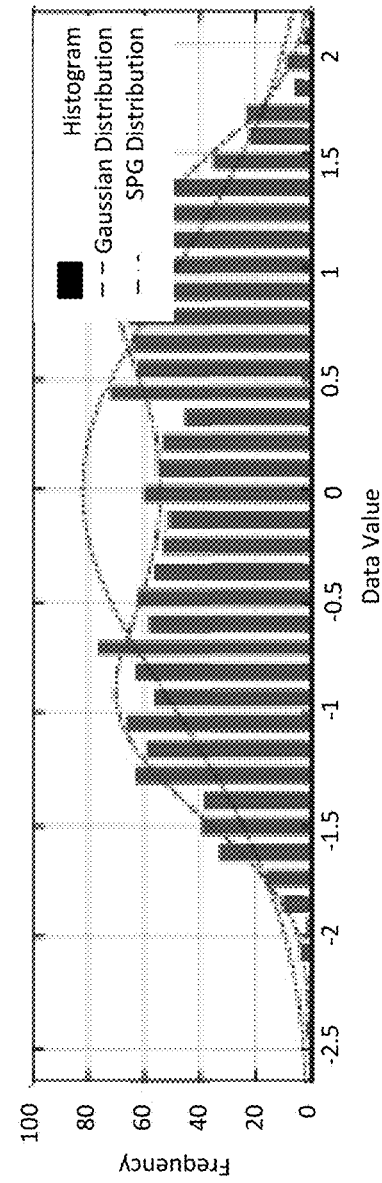
FIG. 4B illustrates a histogram of the dataset in FIG. 4A and Gaussian and SPG distribution fit.

FIG. 4A shows one-minute of current magnitude data from another power system when forced oscillation occurred. In this case, sustained sinusoidal oscillations in the data are clear and can easily be distinguished from noise. FIG. 4A shows that the band-pass filter is able to filter out slow trends while preserving the oscillations. In FIG. 4B, the binned histogram of the filtered data as well as the expected PDF for two distributions are plotted. For Gaussian fit, DoF and $D_{x^2}$ are calculated to be 39 and 125.98, respectively. Using a Chi-squared table, the probability that the filtered data has Gaussian distribution is 0.000, indicating that the data does not have Gaussian distribution. For SPG fit, the best estimation for SNR was 5.13. DoF and $D_{x^2}$ are calculated to be 38 and 21.58, respectively. The probability that the filtered data has SPG distribution is estimated to be 0.985.

Figure 5A:
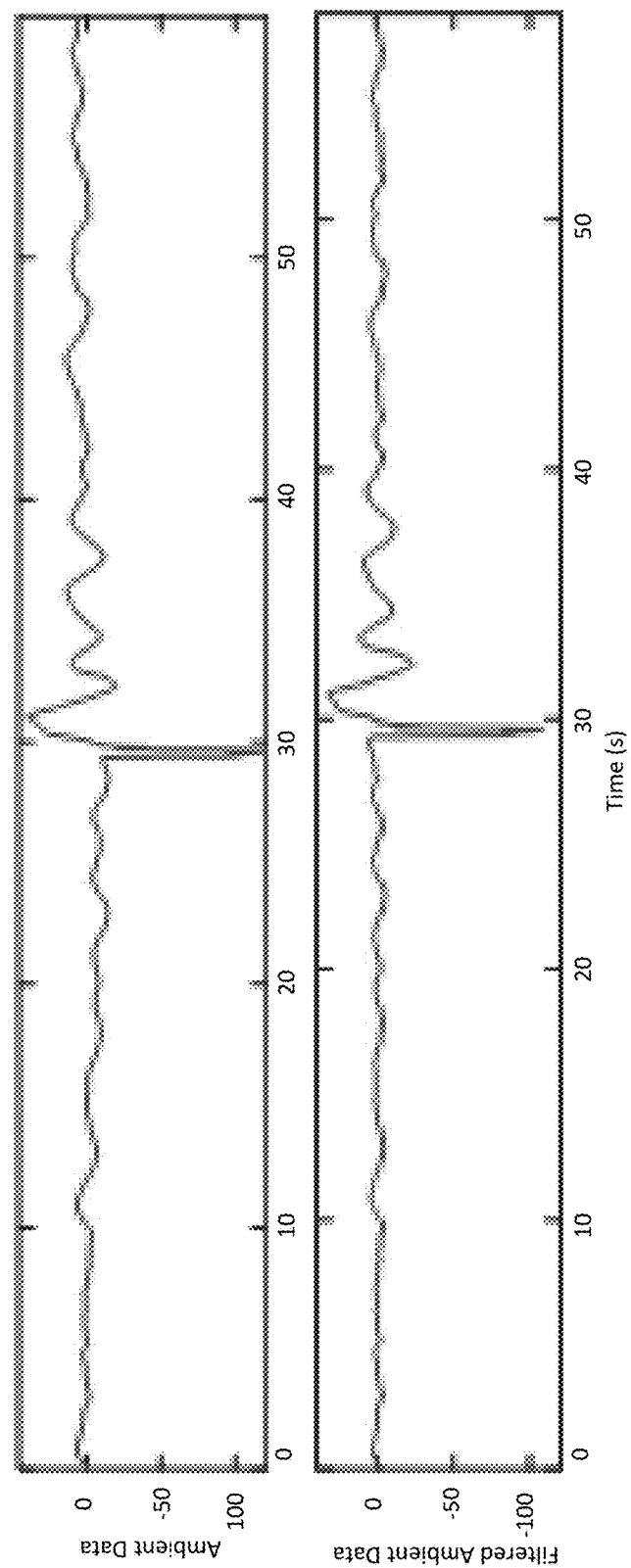
FIG. 5A shows one-minute of example current magnitude data from a PMU in another power system that contains a power system event.
Figure 5B:
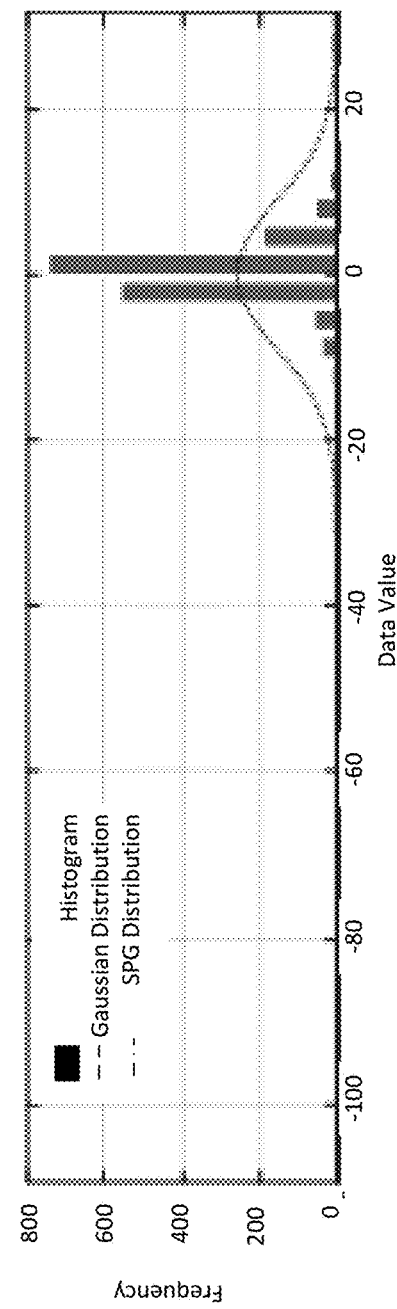
FIG. 5B illustrates a histogram of the dataset in FIG. 5A and Gaussian and SPG distribution fit.

Events in the power systems can be caused by faults, line outages, brake tests, tap changings etc. Example events can include power outages, low voltage, voltage/current fluctuations, etc. FIG. 5A shows one-minute of current magnitude data from a power system when an event occurred in the middle of the time window. Data before and after the event seemed to have typical ambient pattern. FIG. 5B shows the binned histogram of the filtered data and the expected PDF of a Gaussian distribution with the same mean and variance. For Gaussian fit, DoF and $D_{x^2}$ are calculated to be 22 and 890.50, respectively. Using a Chi-squared table, the probability that the filtered data has Gaussian distribution is 0.000. For SPG fit, DoF and $D_{x^2}$ are calculated to be 21 and 1748.00, respectively. The probability that the filtered data has SPG distribution is estimated to be 0.000. The confidence value for validity Gaussian and SPG distribution for this case is almost zero, as expected.

Abnormalities or anomalies in PMU phasor measurement data can happen in many ways. For example, the phasor measurement data may include multiple missing data points, jumps, constant value intervals, data compression, etc. FIG. 6A shows another one-minute of voltage magnitude data from a power system in which data compression is clearly noticeable. Such phasor measurement data is considered to be unusable and does not include any Gaussian or SPG distribution. FIG. 6B shows the binned histogram of the filtered data and expected PDF of a Gaussian and SPG distribution. For Gaussian fit, DoF and $D_{x^2}$ are calculated to be 24 and 1552.6, respectively. Using Chi-squared table, the probability that the filtered data has Gaussian distribution is 0.000. For SPG fit, DoF and $D_{x^2}$ are calculated to be 23 and 1549.5, respectively. The probability that the filtered data has SPG distribution is estimated to be 0.000.

Figure 7:
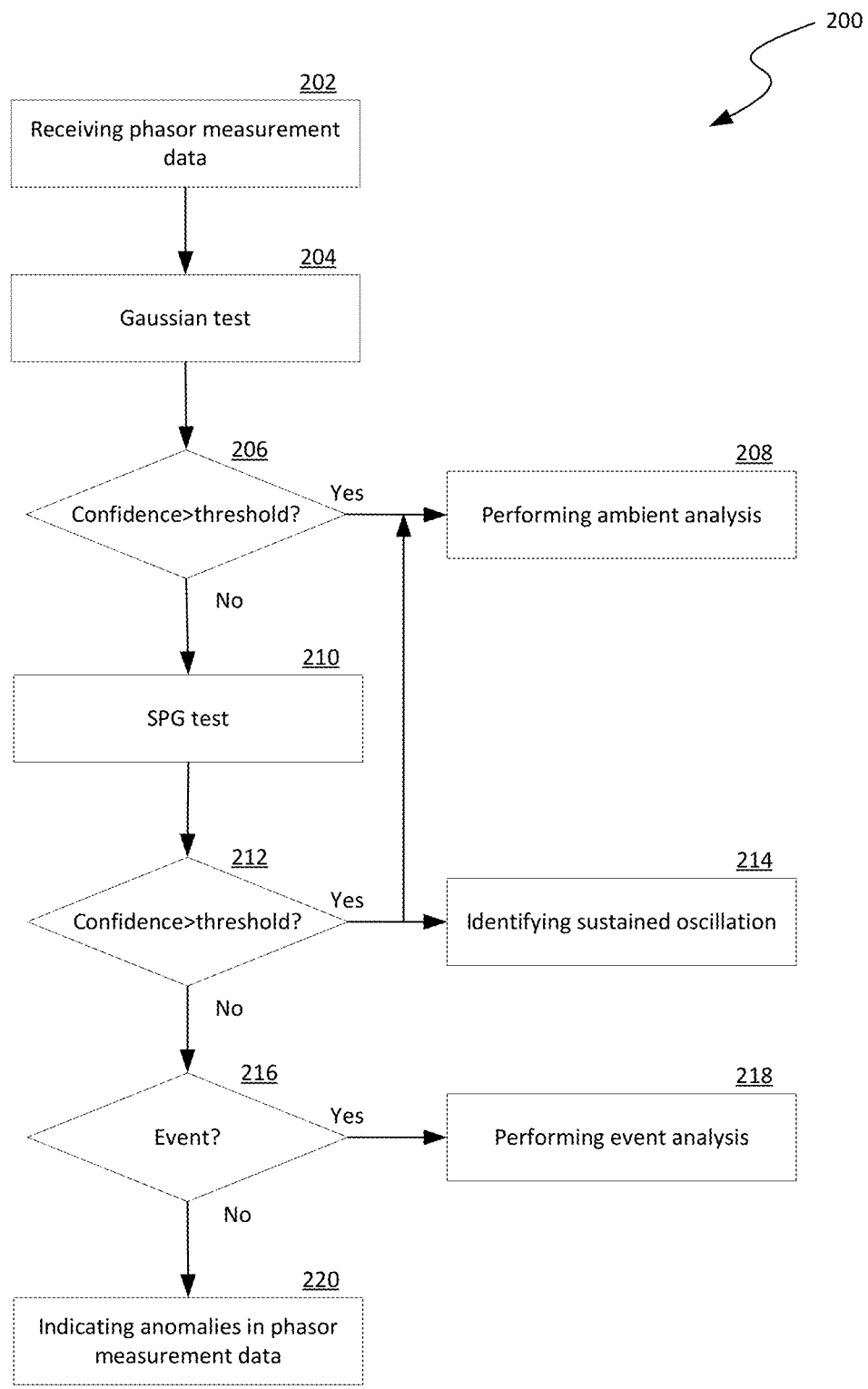
FIG. 7 is a flowchart illustrating a process 200 for analyzing phasor measurement data in accordance with embodiments of the disclosed technology.

Based on the observations discussed above with reference to FIGS. 2A-6B, a framework for characterizing PMU phasor measurement data can be developed, as discussed below in more detail with reference to FIG. 7. FIG. 7 is a flowchart illustrating a process 200 for analyzing phasor measurement data according to the framework. As shown in FIG. 7, the process 200 includes receiving phasor measurement data at stage 202. The phasor measurement data can be received from the PMUs 114 (FIG. 1), the PDC 116, or other suitable components of the power system 100 in FIG. 1.

The process 200 can then include performing a Gaussian test on the received phasor measurement data at stage 204. In certain embodiments, performing the Gaussian test can include fitting the receiving phasor measurement data into a Gaussian distribution and calculate a confidence level of the fit. In other implementations, performing the Gaussian test can include deriving a Gaussian function based on the received phasor measurement data and corresponding confidence level. The process 200 can then include a decision stage 206 to determine whether the derived Gaussian confidence level is above a Gaussian confidence threshold (e.g., 0.90, 0.95, 0.99, etc.). In response to determining that the Gaussian confidence level is above the Gaussian confidence threshold, the process 200 can include performing ambient analysis based on the received phasor measurement data at stage 208. Example ambient analysis can include voltage stability analysis or other suitable types of analysis.

Based on the performed ambient analysis, the supervisory computer station 118 (FIG. 1) or other suitable components of the power system 100 in FIG. 1 can automatically apply one or more electrical circuit control actions. Example control actions can include automatic closure of electrical circuits, automatic load rejection, automatic switching of shunt capacitors, automatic blocking of transformer tap changing, excitation of voltage regulators at the generating stations, use of tap changing transformers at sending end and receiving end of the transmission lines, switching in shunt reactors during low loads, switching in shunt capacitors during high loads or low power factor loads, use of series capacitors in long transmission lines and distribution lines in case of load fluctuations, use of tap changing transformers in industries, substations, distribution substations, use of static shunt compensation having shunt capacitors and control for step-less control of reactive power, use of synchronous condensers in receiving end substations for reactive power compensation, or other suitable power system control mechanisms.

In response to determining that the Gaussian confidence level is below the Gaussian confidence threshold, the process 200 can proceed to performing a SPG test at stage 210. In certain implementations, performing the SPG test can include fitting the received phasor measurement data to a SPG model according to Equations (4)-(7) discussed above. However, two difficulties may exist for fitting an SPG distribution to a set of phasor measurement data. First, suppose Newton's method is solved successfully and A and a are known. The computational burden introduced by the calculation of expected PDF from Equation (4) may render the analysis slow. To overcome this difficulty, tabular format of PDFs for different values of Signal to Noise ratio (SNR) defined as $A^2/2\sigma^2$, is prepared before the analysis. This table contains pre-calculated PDFs for a number of values of SNR, ranging from 0 to 200. Value of µ is assumed to be 0 which means all PDFs in the table are centralized around the mean value. For this table, at low values of SNR (e.g., lower than 20), σ is assumed to be 1 whereas for higher SNRs, A is set to 1 and the other parameters are calculated accordingly. When A and σ are estimated from the Newton's method, the SPG PDF that corresponds to the estimated SNR can be extracted from the table by interpolating the pre-calculated values.

The second difficulty is to assign reasonable initial values to A and σ to start Newton's method. As SNR increases from zero, the distribution becomes less dense in the center. Additionally, the single peak in the center breaks into two peaks when SNR passes a certain value. This property can be translated into the form of an area under the curve around the center and be used to estimate an initial value for SNR. The mentioned area monotonically increases as a function of SNR which means any value for the measured area can be mapped into an SNR value by using the curve except for low SNR values. For low SNRs, the curve has a constant zero value, because the PDF has only one peak. This is not an issue since the estimated SNR, along with Equation (6) would only provide initial values for the unknowns of the Newton's method. A table containing values of peak-peak area for different values of SNR is pre-calculated. For a given data set, the mentioned area can be calculated by using the histogram of data and then compared with the pre-calculated area-SNR table to give an initial estimation for SNR.

Upon completion of the SPG test, the process 200 includes another decision stage 212 to determine whether the SPG confidence level is above a SPG confidence threshold (e.g., 75%, 85%, 95%, etc.). In response to determining that the SPG confidence level is above the SPG confidence threshold, the received phasor measurement data can be used for performing event analysis at stage 218 and/or performing ambient analysis at stage 208. In response to determining that the SPG confidence level is not above the SPG confidence threshold, the process 200 can include indicating that the received phasor measurement data has anomalies and preventing using such phasor measurement data for any ambient or event analysis at stage 220.

Several embodiments of the framework described above with reference to FIG. 7 have been used in experiments to test phasor measurement data from actual power systems. The experiments showed that, a large portion of the phasor measurement data, when de-trended, has Gaussian or Gaussian plus one sinusoid distribution with high or intermediate confidence values. As such, phasor measurement data can be categorized systematically. The framework can thus be used to capture different anomalies in the phasor measurement data as well as to locate valuable parts of data for modal analysis and event detection.

Figure 8:
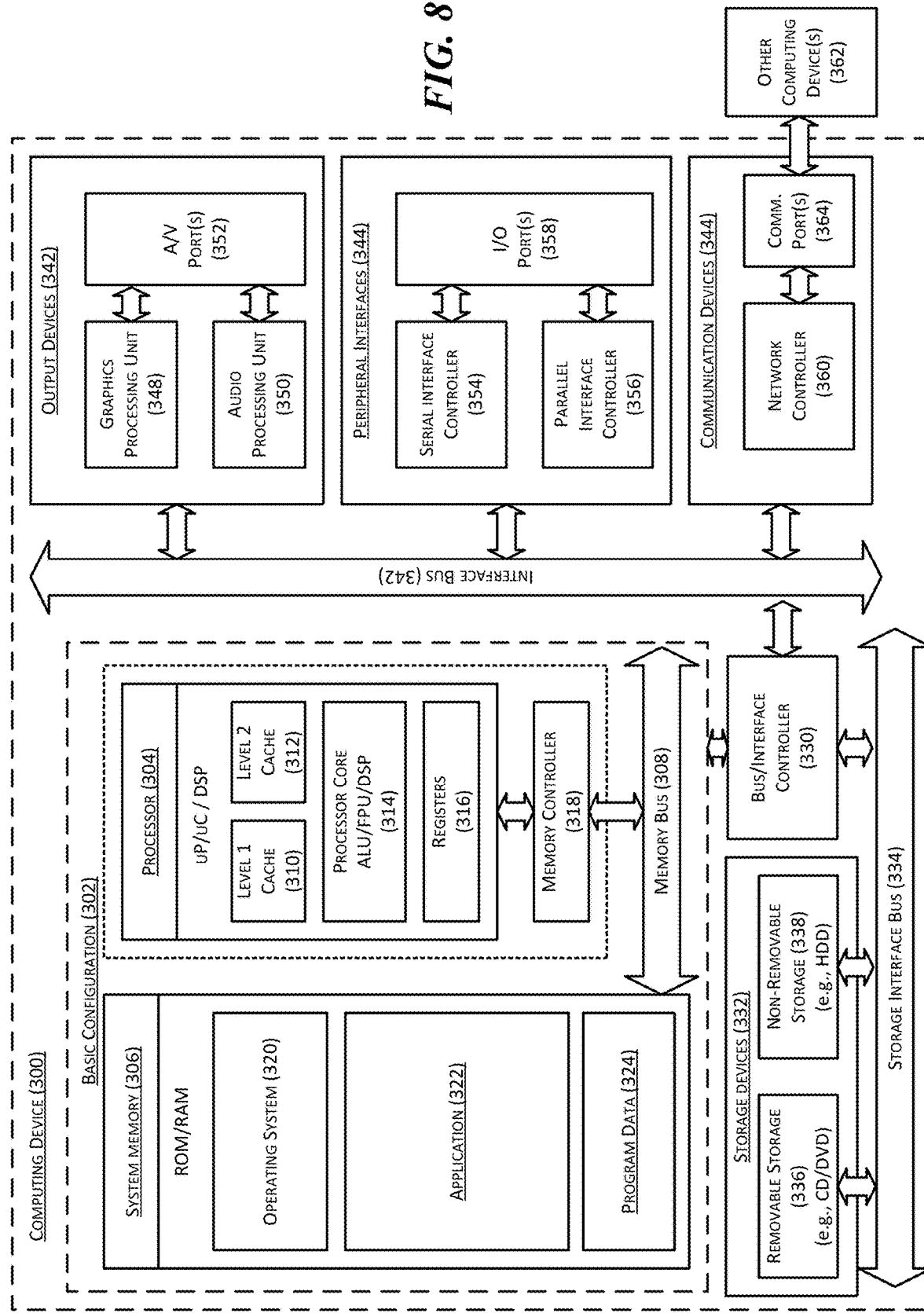
FIG. 8 is a computing device suitable for certain components of the power system in FIG. 1.

FIG. 8 is a computing device 300 suitable for certain components of the power system 100 in FIG. 1. For example, the computing device 300 can be suitable for the PDC 116 or the supervisory computer station 118 of FIG. 1. In a very basic configuration 302, the computing device 300 can include one or more processors 304 and a system memory 306. A memory bus 308 can be used for communicating between processor 304 and system memory 306.

Depending on the desired configuration, the processor 304 can be of any type including but not limited to a microprocessor (µP), a microcontroller (µC), a digital signal processor (DSP), or any combination thereof. The processor 304 can include one more levels of caching, such as a level-one cache 310 and a level-two cache 312, a processor core 314, and registers 316. An example processor core 314 can include an arithmetic logic unit (ALU), a floating point unit (FPU), a digital signal processing core (DSP Core), or any combination thereof. An example memory controller 318 can also be used with processor 304, or in some implementations memory controller 318 can be an internal part of processor 304.

Depending on the desired configuration, the system memory 306 can be of any type including but not limited to volatile memory (such as RAM), non-volatile memory (such as ROM, flash memory, etc.) or any combination thereof. The system memory 306 can include an operating system 320, one or more applications 322, and program data 324. This described basic configuration 302 is illustrated in FIG. 8 by those components within the inner dashed line.

The computing device 300 can have additional features or functionality, and additional interfaces to facilitate communications between basic configuration 302 and any other devices and interfaces. For example, a bus/interface controller 330 can be used to facilitate communications between the basic configuration 302 and one or more data storage devices 332 via a storage interface bus 334. The data storage devices 332 can be removable storage devices 336, non-removable storage devices 338, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data. The term "computer readable storage media" or "computer readable storage device" excludes propagated signals and communication media.

The system memory 306, removable storage devices 336, and non-removable storage devices 338 are examples of computer readable storage media. Computer readable storage media include, but not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other media which can be used to store the desired information and which can be accessed by computing device 300. Any such computer readable storage media can be a part of computing device 300. The term "computer readable storage medium" excludes propagated signals and communication media.

The computing device 300 can also include an interface bus 340 for facilitating communication from various interface devices (e.g., output devices 342, peripheral interfaces 344, and communication devices 346) to the basic configuration 302 via bus/interface controller 330. Example output devices 342 include a graphics processing unit 348 and an audio processing unit 350, which can be configured to communicate to various external devices such as a display or speakers via one or more A/V ports 352. Example peripheral interfaces 344 include a serial interface controller 354 or a parallel interface controller 356, which can be configured to communicate with external devices such as input devices (e.g., keyboard, mouse, pen, voice input device, touch input device, etc.) or other peripheral devices (e.g., printer, scanner, etc.) via one or more I/O ports 358. An example communication device 346 includes a network controller 360, which can be arranged to facilitate communications with one or more other computing devices 362 over a network communication link via one or more communication ports 364.

The network communication link can be one example of a communication media. Communication media can typically be embodied by computer readable instructions, data structures, program modules, or other data in a modulated data signal, such as a carrier wave or other transport mechanism, and can include any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), microwave, infrared (IR) and other wireless media. The term computer readable media as used herein can include both storage media and communication media.

The computing device 300 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. The computing device 300 can also be implemented as a personal computer including both laptop computer and non-laptop computer configurations.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. A method for controlling electrical circuits in a power system having one or more phasor measurement units interconnected to a supervisory computer, the method comprising:
    fitting, at the supervisory computer, phasor measurement data received from the one or more phasor measurement units into a Gaussian distribution with a corresponding Gaussian confidence level, the phasor measure data having multiple data points individually representing a measured phasor of the power system;
    when the Gaussian confidence level of the fitted Gaussian distribution is not above a Gaussian confidence threshold,
        fitting, at the supervisory computer, the received phasor measurement data into a sinusoidal plus Gaussian (SPG) distribution with a corresponding SPG confidence level; and
        when the SPG confidence level of the fitted SPG distribution is above a SPG confidence threshold,
            performing, at the supervisory computer, an ambient analysis on the received phasor measurement data to determine an operating characteristic of the power system; and
            automatically applying, at the supervisory computer, at least one electrical circuit control action to the power system in response to the determined operating characteristic.

2. The method of claim 1, further comprising:
    when the SPG confidence level of the fitted SPG distribution is above a SPG confidence threshold,
        identifying a sustained oscillation in the power system; and
        automatically applying, at the supervisory computer, another electrical circuit control action to suppress the sustained oscillation in the power system.

3. The method of claim 1, further comprising:
    in response to determining that the SPG confidence level of the fitted SPG distribution is not above the SPG confidence threshold,
        determining whether a power event occurred in the power system during a time window corresponding to the received phasor measurement data; and
        in response to determining that a power event occurred in the power system during the time window corresponding to the received phasor measurement data, performing event analysis to identify a cause of the power event based on the received phasor measurement data.

4. The method of claim 1, further comprising:
    when the SPG confidence level of the fitted SPG distribution is not above the SPG confidence threshold,
        determining whether a power event occurred in the power system during a time window corresponding to the received phasor measurement data; and
        in response to determining that a power event did not occur in the power system during the time window corresponding to the received phasor measurement data, indicating that a data anomaly exists in the received phasor measurement data.

5. The method of claim 1 wherein automatically applying the at least one electrical circuit control action includes automatically applying at least one of the following:
    excitation of a voltage regulator at a generating station of the power system;
    use of tap changing transformers at sending end and receiving end of a transmission line;
    switching in shunt reactors during low loads;
    switching in shunt capacitors during high loads or low power factor loads;
    use of series capacitors in long transmission lines in case of load fluctuations;
    use of tap changing transformers substations;
    use of static shunt compensation having shunt capacitors and control for step-less control of reactive power; or
    use of synchronous condensers in receiving end substations for reactive power compensation.

6. A supervisory computer for controlling electrical circuits in a power system having one or more phasor measurement units interconnected to the supervisory computer via a communications network, the supervisory computer comprising:
    a processor; and
    a memory containing instructions executable by the processor to cause the supervisory computer to:
        fit phasor measurement data received from the one or more phasor measurement units of the power system into a Gaussian distribution with a corresponding Gaussian confidence level, the phasor measure data having multiple data points individually representing a measured phasor of the power system;
        determine whether the Gaussian confidence level of the fitted Gaussian distribution is above a Gaussian confidence threshold; and
        in response to determining that the Gaussian confidence level of the fitted Gaussian distribution is above the Gaussian confidence threshold,
            perform an ambient analysis on the received phasor measurement data to determine an operating characteristic of the power system; and
            automatically apply at least one electrical circuit control action to the power system in response to the determined operating characteristic.

7. The supervisory computer of claim 6 wherein the memory contains additional instructions executable by the processor to cause the supervisory computer to:
    in response to determining that the Gaussian confidence level of the fitted Gaussian distribution is not above the Gaussian confidence threshold, fit, at the supervisory computer, the received phasor measurement data into a sinusoidal plus Gaussian (SPG) distribution with a corresponding SPG confidence level;
determine, at the supervisory computer, whether the SPG confidence level of the fitted SPG distribution is above a SPG confidence threshold; and
in response to determining that the SPG confidence level of the fitted SPG distribution is above the SPG confidence threshold,
identify a sustained oscillation in the power system; and
automatically apply, at the supervisory computer, another electrical circuit control action to suppress the sustained oscillation in the power system.

8. The supervisory computer of claim 6 wherein the memory contains additional instructions executable by the processor to cause the supervisory computer to:
in response to determining that the Gaussian confidence level of the fitted Gaussian distribution is not above the Gaussian confidence threshold,
fit, at the supervisory computer, the received phasor measurement data into a sinusoidal plus Gaussian (SPG) distribution with a corresponding SPG confidence level;
determine, at the supervisory computer, whether the SPG confidence level of the fitted SPG distribution is above a SPG confidence threshold; and
in response to determining that the SPG confidence level of the fitted SPG distribution is above the SPG confidence threshold,
perform, at the supervisory computer, an ambient analysis on the received phasor measurement data to determine an operating characteristic of the power system; and
according to the determined operating characteristic, automatically apply, at the supervisory computer, the at least one electrical circuit control action to the power system.

9. The supervisory computer of claim 6 wherein the memory contains additional instructions executable by the processor to cause the supervisory computer to:
in response to determining that the Gaussian confidence level of the fitted Gaussian distribution is not above the Gaussian confidence threshold,
fit, at the supervisory computer, the received phasor measurement data into a sinusoidal plus Gaussian (SPG) distribution with a corresponding SPG confidence level;
determine, at the supervisory computer, whether the SPG confidence level of the fitted SPG distribution is above a SPG confidence threshold; and
in response to determining that the SPG confidence level of the fitted SPG distribution is not above the SPG confidence threshold,
determine whether a power event occurred in the power system during a time window corresponding to the received phasor measurement data; and
in response to determining that a power event occurred in the power system during the time window corresponding to the received phasor measurement data, perform event analysis to identify a cause of the power event based on the received phasor measurement data.

10. The supervisory computer of claim 6 wherein the memory contains additional instructions executable by the processor to cause the supervisory computer to:
in response to determining that the Gaussian confidence level of the fitted Gaussian distribution is not above the Gaussian confidence threshold,
fit, at the supervisory computer, the received phasor measurement data into a sinusoidal plus Gaussian (SPG) distribution with a corresponding SPG confidence level;
determine, at the supervisory computer, whether the SPG confidence level of the fitted SPG distribution is above a SPG confidence threshold; and
in response to determining that the SPG confidence level of the fitted SPG distribution is not above the SPG confidence threshold,
determine whether a power event occurred in the power system during a time window corresponding to the received phasor measurement data; and
in response to determining that a power event did not occur in the power system during the time window corresponding to the received phasor measurement data, indicate that a data anomaly exists in the received phasor measurement data.

11. The supervisory computer of claim 6 wherein to fit the received phasor measurement data into the Gaussian distribution includes to calculate a probability density function (PDF) of the received phasor measurement data as follows:

$$f(x|\mu, \sigma^2) = \frac{1}{\sqrt{2\sigma^2\pi}} \exp\left(-\frac{(x-\mu)^2}{2\sigma^2}\right)$$

where $\mu$ is the mean and $\sigma$ is the standard deviation.

12. A method for controlling electrical circuits in a power system having one or more phasor measurement units interconnected to a supervisory computer, the method comprising:
receiving, from the one or more phasor measurement units of the power system, phasor measure data having multiple data points individually representing a measured phasor of the power system;
fitting, at the supervisory computer, the received phasor measurement data into a Gaussian distribution with a corresponding Gaussian confidence level;
determining, at the supervisory computer, whether the Gaussian confidence level of the fitted Gaussian distribution is above a Gaussian confidence threshold; and
in response to determining that the Gaussian confidence level of the fitted Gaussian distribution is above the Gaussian confidence threshold,
performing, at the supervisory computer, an ambient analysis on the received phasor measurement data to determine an operating characteristic of the power system; and
automatically applying, at the supervisory computer, at least one electrical circuit control action to the power system in response to the determined operating characteristic.

13. The method of claim 12, further comprising:
in response to determining that the Gaussian confidence level of the fitted Gaussian distribution is not above the Gaussian confidence threshold,
fitting, at the supervisory computer, the received phasor measurement data into a sinusoidal plus Gaussian (SPG) distribution with a corresponding SPG confidence level;

determining, at the supervisory computer, whether the SPG confidence level of the fitted SPG distribution is above a SPG confidence threshold; and in response to determining that the SPG confidence level of the fitted SPG distribution is above the SPG confidence threshold,
identifying a sustained oscillation in the power system; and
automatically applying, at the supervisory computer, another electrical circuit control action to suppress the sustained oscillation in the power system.

14. The method of claim 12, further comprising:
in response to determining that the Gaussian confidence level of the fitted Gaussian distribution is not above the Gaussian confidence threshold,
fitting, at the supervisory computer, the received phasor measurement data into a sinusoidal plus Gaussian (SPG) distribution with a corresponding SPG confidence level;
determining, at the supervisory computer, whether the SPG confidence level of the fitted SPG distribution is above a SPG confidence threshold; and
in response to determining that the SPG confidence level of the fitted SPG distribution is above the SPG confidence threshold,
performing, at the supervisory computer, the ambient analysis on the received phasor measurement data to determine an operating characteristic of the power system; and
according to the determined operating characteristic, automatically applying, at the supervisory computer, the at least one electrical circuit control action to the power system.

15. The method of claim 12, further comprising:
in response to determining that the Gaussian confidence level of the fitted Gaussian distribution is not above the Gaussian confidence threshold,
fitting, at the supervisory computer, the received phasor measurement data into a sinusoidal plus Gaussian (SPG) distribution with a corresponding SPG confidence level;
determining, at the supervisory computer, whether the SPG confidence level of the fitted SPG distribution is above a SPG confidence threshold; and
in response to determining that the SPG confidence level of the fitted SPG distribution is not above the SPG confidence threshold,
determining whether a power event occurred in the power system during a time window corresponding to the received phasor measurement data; and
in response to determining that a power event occurred in the power system during the time window corresponding to the received phasor measurement data, performing event analysis to identify a cause of the power event based on the received phasor measurement data.

16. The method of claim 12, further comprising:
in response to determining that the Gaussian confidence level of the fitted Gaussian distribution is not above the Gaussian confidence threshold,
fitting, at the supervisory computer, the received phasor measurement data into a sinusoidal plus Gaussian (SPG) distribution with a corresponding SPG confidence level;
determining, at the supervisory computer, whether the SPG confidence level of the fitted SPG distribution is above a SPG confidence threshold; and
in response to determining that the SPG confidence level of the fitted SPG distribution is not above the SPG confidence threshold,
determining whether a power event occurred in the power system during a time window corresponding to the received phasor measurement data; and
in response to determining that a power event did not occur in the power system during the time window corresponding to the received phasor measurement data, indicating that a data anomaly exists in the received phasor measurement data.

17. The method of claim 12 wherein fitting the received phasor measurement data into the Gaussian distribution includes calculating a probability density function (PDF) of the received phasor measurement data as follows:

$$f(x|\mu, \sigma^2) = \frac{1}{\sqrt{2\sigma^2\pi}} \exp\left(-\frac{(x-\mu)^2}{2\sigma^2}\right)$$

where $\mu$ is the mean and $\sigma$ is the standard deviation.

18. The method of claim 12 wherein automatically applying the at least one electrical circuit control action includes automatically applying at least one of the following:
excitation of a voltage regulator at a generating station of the power system;
use of tap changing transformers at sending end and receiving end of a transmission line;
switching in shunt reactors during low loads;
switching in shunt capacitors during high loads or low power factor loads;
use of series capacitors in long transmission lines in case of load fluctuations;
use of tap changing transformers substations;
use of static shunt compensation having shunt capacitors and control for step-less control of reactive power; or
use of synchronous condensers in receiving end substations for reactive power compensation.

19. The method of claim 12, further comprising:
in response to determining that the Gaussian confidence level of the fitted Gaussian distribution is above the Gaussian confidence threshold, indicating that the received phasor measurement data does not include data anomalies.

20. The method of claim 12, further comprising:
in response to determining that the Gaussian confidence level of the fitted Gaussian distribution is not above the Gaussian confidence threshold,
fitting, at the supervisory computer, the received phasor measurement data into a SPG distribution with a corresponding SPG confidence level;
determining, at the supervisory computer, whether the SPG confidence level of the fitted SPG distribution is above a SPG confidence threshold; and
in response to determining that the SPG confidence level of the fitted SPG distribution is above the SPG confidence threshold, indicating that the received phasor measurement data does not include data anomalies.

* * * * *